United States Patent
Yang et al.

(10) Patent No.: US 6,924,220 B1
(45) Date of Patent: Aug. 2, 2005

(54) SELF-ALIGNED GATE FORMATION USING POLYSILICON POLISH WITH PERIPHERAL PROTECTIVE LAYER

(75) Inventors: Kai Yang, San Jose, CA (US); John Jianshi Wang, San Jose, CA (US); Unsoon Kim, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 810 days.

(21) Appl. No.: 09/922,536

(22) Filed: Aug. 3, 2001

(51) Int. Cl.[7] .......................................... H01L 21/3201
(52) U.S. Cl. .................. 438/593; 438/594; 438/257; 257/315; 257/316
(58) Field of Search ............................... 438/593–594, 438/257–267, 296; 257/315–316

(56) References Cited

U.S. PATENT DOCUMENTS 6,271,561 B2 * 8/2001 Doan .......................... 257/316

* cited by examiner

Primary Examiner—Dung A. Le
(74) Attorney, Agent, or Firm—Farjami & Farjami LLP (57) ABSTRACT

A method of protecting a peripheral region, by forming a protective mask over the peripheral area, during polysilicon polishing while forming self-aligned polysilicon gates in flash memory circuits. In one aspect, the protective mask is formed over a substantial area of the Peripheral region. In another aspect, the protective mask is formed over a substantial area of an active part of the peripheral region.

13 Claims, 7 Drawing Sheets

SELF-ALIGNED GATE FORMATION USING POLYSILICON POLISH WITH PERIPHERAL PROTECTIVE LAYER

CROSS REFERENCE TO RELATED APPLICATION

This application is related to the concurrently filed application Ser. No. 09/922,354, entitled "Insertion of Dummy Trenches to Avoid Silicon Damage for Self Aligned Polygate Process".

FIELD OF THE INVENTION

This invention deals with integrated circuit manufacturing processes, and in particular to a process for forming a self-aligned gate for flash memory application using polysilicon polish.

BACKGROUND OF THE INVENTION

Self-aligned gate formation is desirable in integrated circuit fabrication processes. Use of self-aligned gates avoids problems caused by lithography misalignment, which become increasingly severe when critical dimensions are pushed below 0.18 microns. Critical dimension control is also improved by use of self-aligned gates.

A process for forming a self-aligned gate for a floating gate device is illustrated in FIGS. 1a–1d.

Figure 1A:
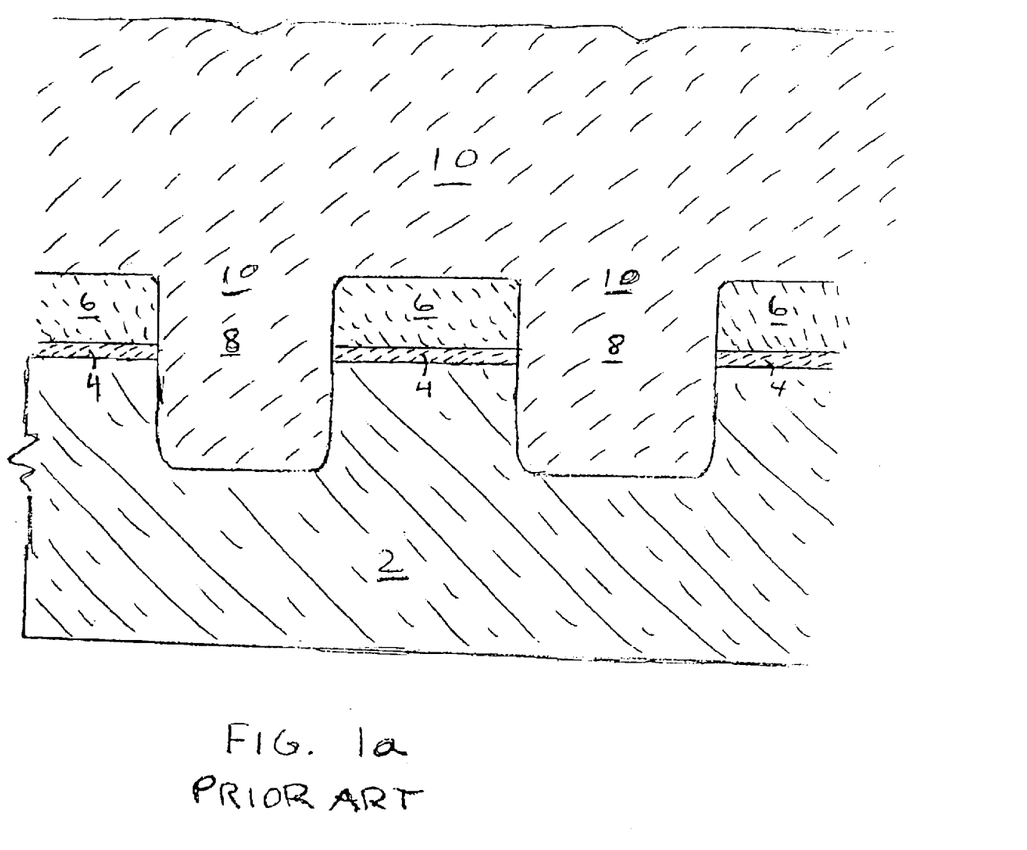
FIG. 1a illustrates an intermediate structure during self aligned poly gate formation after shallow trench etch and fill.

FIG. 1a shows silicon substrate 2 with pad oxide 4 generally of thickness 100–200 Angstroms grown thereon. Silicon nitride layer 6, generally of thickness 1200–2000 Angstroms is deposited atop the pad oxide. Shallow trench etching is performed to form trenches 8, usually of depth 0.25–0.4 micron and width 0.25–0.35 micron. Following trench etch, the trenches are filled with TEOS 10 deposited at low temperature, approximately 600 C in a furnace in one atmosphere of oxygen.

Figure 1B:
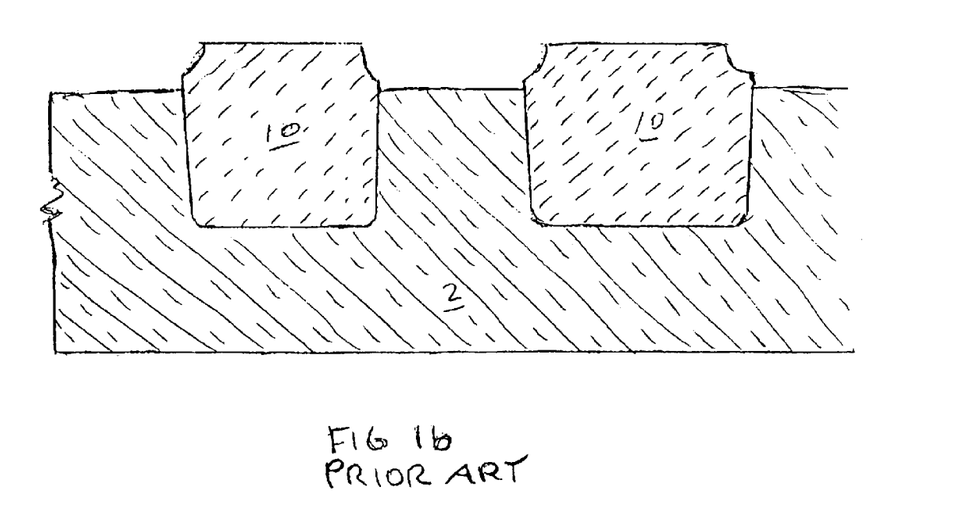
FIG. 1b illustrates an intermediate structure during self aligned poly gate formation after TEOS CMP and removal of SiN and pad oxide.

Oxide CMP is performed, which removes the excess TEOS and stops on SiN 6. Overpolish removes approximately half the SiN. The remainder of the SiN is removed using wet etch techniques, then the remaining pad oxide 4 is also removed with an isotropic wet clean step. The intermediate structure following pad oxide removal is shown in FIG. 1b.

Figure 1C:
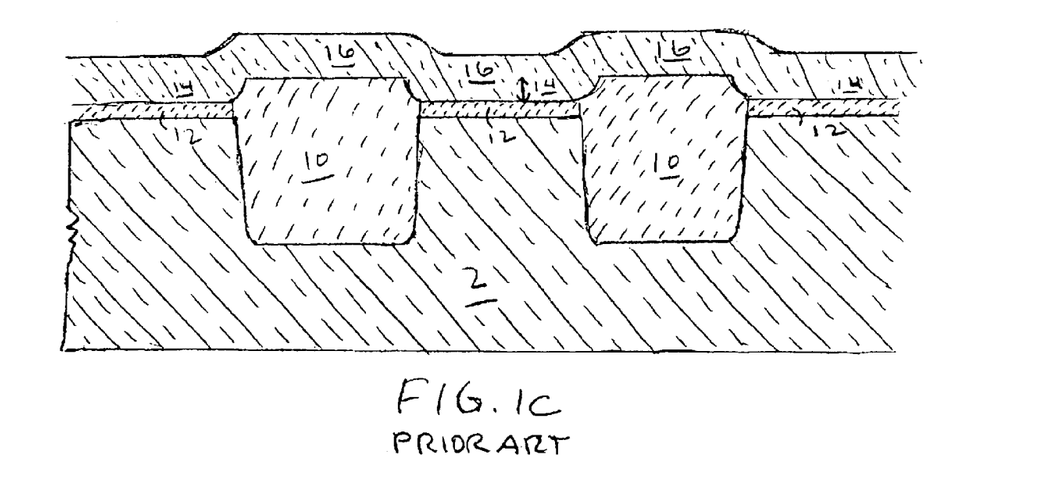
FIG. 1c illustrates an intermediate structure during self aligned poly gate formation after tunnel oxide growth and poly deposition.
Figure 1D:
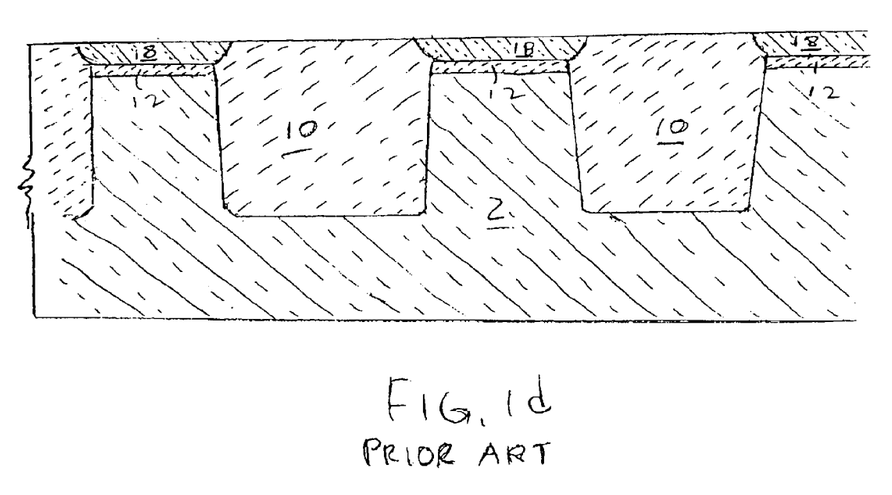
FIG. 1d illustrates an intermediate structure during self aligned poly gate formation after CMP of polysilicon.

Tunnel oxide layer 12 is formed, generally but not always by dry oxidation and having a thickness of 80–120 Angstroms, leaving recessed region 14 of depth between 500 and 1500 Angstroms. Polysilicon layer 16 of thickness between 600 and 1800 Angstroms, depending on the depth of recessed region 14, is next deposited. The intermediate structure after deposition of poly layer 16 is shown in FIG. 1c. Finally, Chemical Mechanical Polishing (CMP) is performed using a slurry having high polysilicon-to-silicon dioxide selectivity to remove the polysilicon atop the trench oxide 10, leaving self-aligned polysilicon gate 18. FIG. 1d shows the self-aligned gate structure following CMP of polysilicon.

The aforementioned self-aligned poly gate process using poly CMP has great potential for improving density of flash memory circuits, but has not been successfully implemented in manufacturing of flash memory due to associated problems.

Figure 2:
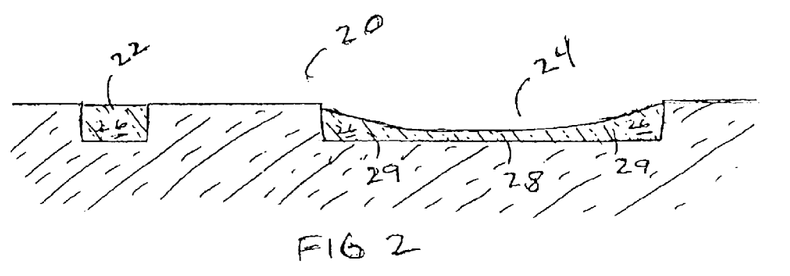
FIG. 2 illustrates the problem of dishing after CMP.

In order to assure complete removal of the polysilicon atop filled trenches 8, overpolish of the polysilicon is required. A problem in CMP, particularly during overpolish, is known as recession or dishing, which is illustrated in FIG. 2. Uneven wafer surface 20 has recessed regions 22 and 24, region 24 having much larger surface area than region 22. Deposited layer 26 is polished off of the surface, but in the center 28 of large surface area region 24 the surface of the polished deposited layer 26 is at a lower level than at the edge 29 of region 24 or in small surface area region 22.

The dishing effect can cause severe problems during the formation of a memory cell array using the aforementioned self-aligned poly gate process. In the peripheral area of a flash memory chip, there are some active silicon regions having large feature size, e.g., large transistors for signal input/output ports, capacitors, etc. A typical flash memory chip includes 70–75% of the area as the flash memory array, with the remaining 25–30% of the area being the peripheral area containing the large feature control circuitry. Read, write, and erase functions are provided by the flash memory chip.

Figure 3:
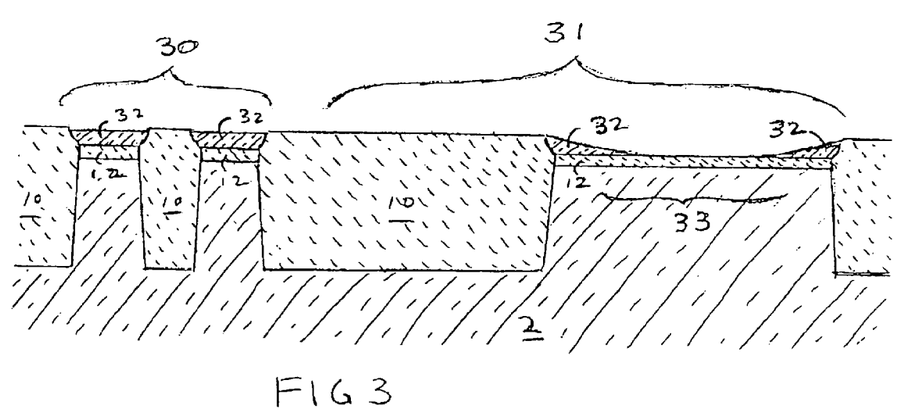
FIG. 3 illustrates dishing in large peripheral device regions following poly CMP during self aligned poly gate formation.

FIG. 3 illustrates the dishing problem after polysilicon CMP. Core region 30 of the memory cell array has small feature size, i.e., less than 3 microns, with the majority of devices having critical dimensions below 0.3 microns (usually 0.24–0.3 microns), and therefore little problem with dishing. However, peripheral region 31 having large feature size, i.e., as large as 100 microns or greater, evidences considerable dishing of the polysilicon 32, yielding very thin polysilicon in the center of feature 33, or in the worst case complete removal of the polysilicon in the center. This can have serious consequences. In the formation of flash memory circuits, following the polysilicon polish step, an Oxide-Nitride-Oxide (ONO) interpoly layer is deposited atop the wafer, and subsequently etched off the peripheral devices, which are standard CMOS devices rather than the insulated gate devices found in the central memory region of the flash memory chip, and which do not employ the ONO layer. The ONO etch is followed by stripping of the polysilicon for the large feature size peripheral CMOS devices. If during poly CMP the polysilicon is completely removed over portions of large feature size active regions, as described above when severe dishing occurs, the ONO etch will etch through tunnel oxide layer 12, and the subsequent polysilicon strip will etch into the underlying silicon substrate 2, causing serious damage to the devices. In addition, during ONO overetch in the peripheral regions, the trench isolation oxide may be significantly thinned. In some cases, the seam in the trench oxide might be opened or enlarged, which may have negative impact on device performance.

SUMMARY OF THE INVENTION

It is therefore an object of this invention to provide a method for minimizing polysilicon dishing in large feature size peripheral devices during formation of self-aligned CMP floating polysilicon gates.

It is a further object of this invention to provide a method for utilizing self-aligned CMP polysilicon gates in the formation of flash memory circuits.

These objects are accomplished by use of patterned protection layers on the peripheral chip regions during the poly CMP step of self aligned poly gate formation.

DETAILED DESCRIPTION OF THE INVENTION

Our invention utilizes a protective patterned layer over a portion of the peripheral region during polysilicon CMP. The protective layer may be comprised of silicon dioxide or silicon nitride, and has a thickness between 30 and 300 Angstroms, preferably in the range between 50 and 200 Angstroms.

Figure 4A:
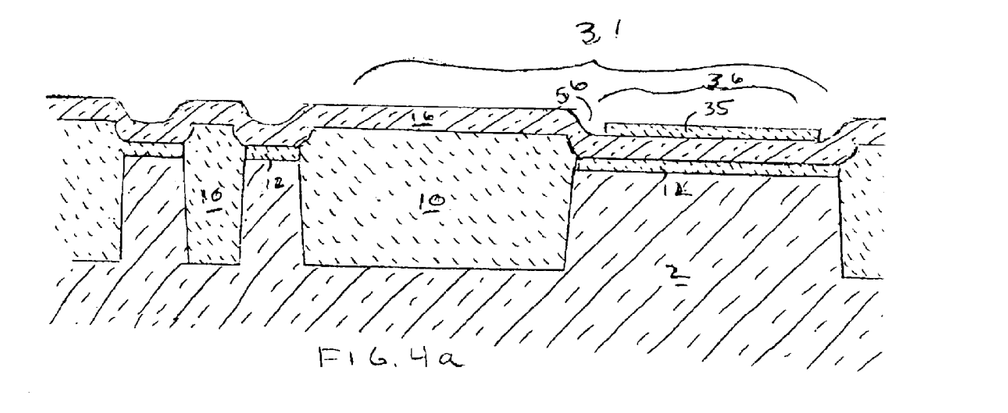
FIG. 4a illustrates a protective mask utilized in a first embodiment of the invention.

A first embodiment of our invention utilizes a protective mask 35 which is patterned to be slightly smaller than the large surface active silicon areas in the peripheral region 31, as illustrated in FIG. 4a. A second embodiment of our invention utilizes a protective mask 35' which is patterned to be larger than the active silicon areas 36 in the peripheral region 31, as illustrated in FIG. 4b.

Figure 4B:
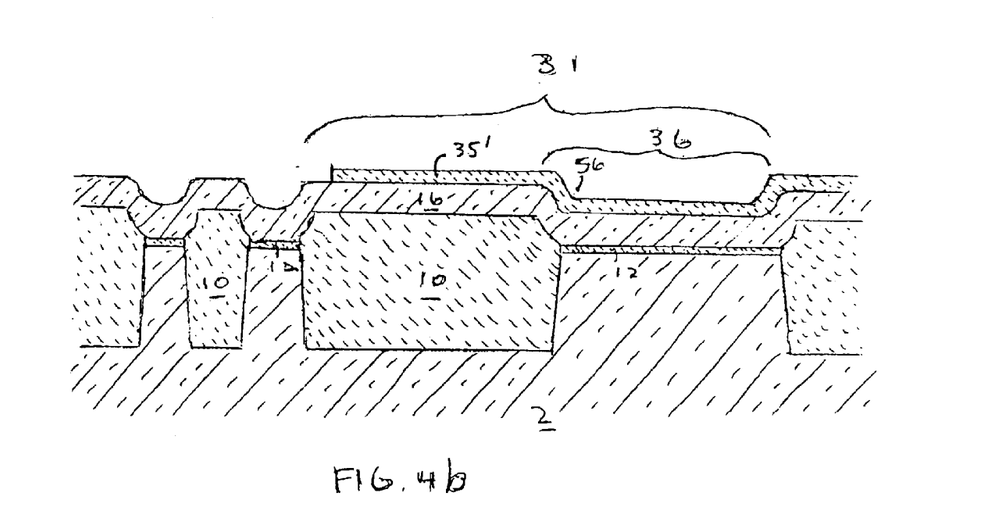
FIG. 4b illustrates a protective mask utilized in a second embodiment of the invention.
Figure 5:
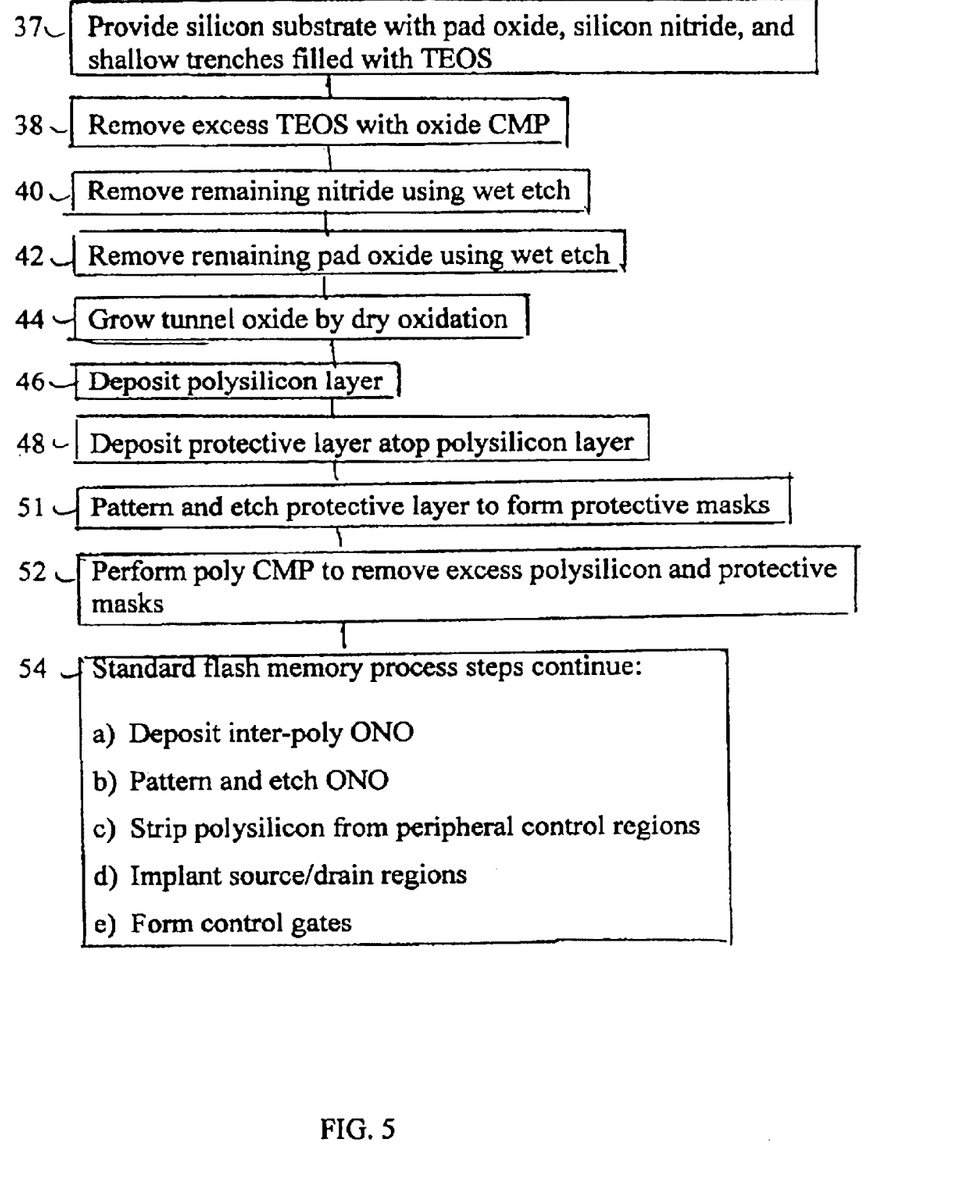
FIG. 5 is a flow chart for the inventive process.

FIG. 5 is a process flow chart which incorporates the protective layers shown in FIGS. 4a and 4b.

In step 37, a silicon substrate 2 is provided having pad oxide 4 thereon, having silicon nitride layer 6 atop pad oxide 4, and having etched shallow trenches 8 filled with TEOS 10.

In step 38, oxide CMP is performed to remove excess TEOS atop nitride layer 6, stopping on nitride layer 6.

In step 40, remaining nitride layer 6 is removed using wet etch techniques.

In step 42, remaining pad oxide 4 is removed using wet etch techniques.

In step 44, tunnel oxide layer 12 is formed.

In step 46, polysilicon layer 16 is deposited.

In step 48, protective layer 50 is deposited atop polysilicon layer 16. The protective layer may be comprised of silicon dioxide or silicon nitride by way of example.

In step 51, the protective layer 50 is patterned using standard lithographic techniques, and is thereafter etched using standard dry etch techniques to yield protective masks 35 or 35' on large feature size regions in the peripheral device areas 30 of the chip.

In step 52, polysilicon CMP is performed, removing protective masks 35 or 35' as well as excess polysilicon. Self-aligned polysilicon gates 18 remain in the core region 30.

Figure 6A:
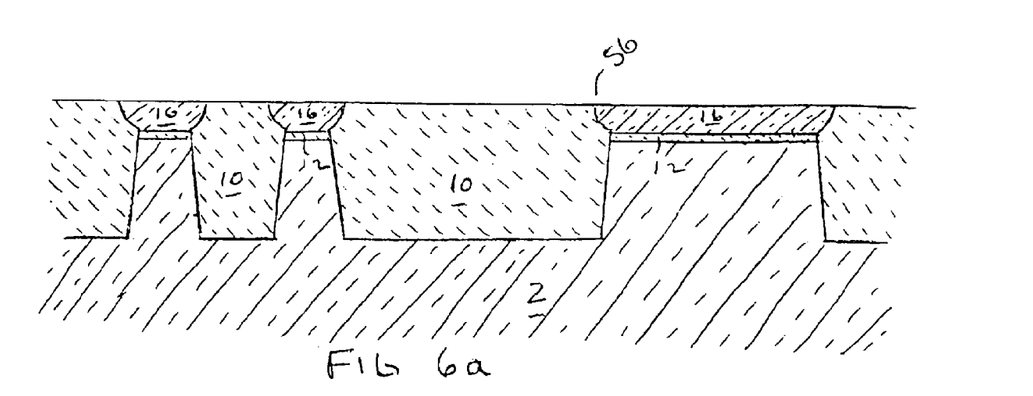
FIG. 6a illustrates the structure resultant from the first embodiment of the inventive process following polysilicon CMP.
Figure 6B:
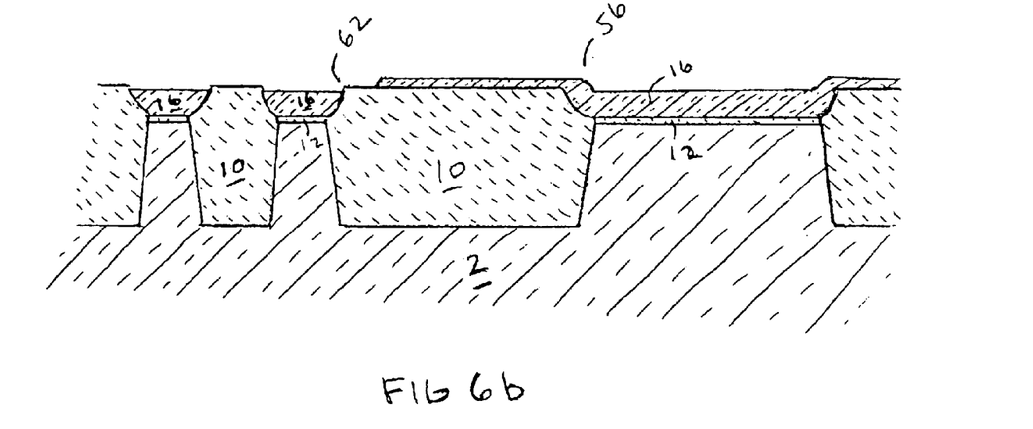
FIG. 6b illustrates the structure resultant from the second embodiment of the inventive process following polysilicon CMP.

In step 54, standard flash memory processing follows:
a) Inter-poly ONO 64 is deposited
b) ONO is patterned and etched
c) Polysilicon is stripped from peripheral control regions
d) Source/drain regions 66 are implanted
e) Control gates 68 are formed FIGS. 6a and 6b illustrate the two embodiments after polysilicon CMP.

FIG. 6a illustrates the first embodiment of our inventive process after polysilicon CMP. The patterned protective mask 35 shown in FIG. 4a may be produced by utilizing a photomask obtained by shrinking the feature size from the design of the active silicon mask in the peripheral regions 31. The shrinking dimension can be in the range from 0.1 micron to 5 microns, preferably between 0.3 micron and 1 micron. The active silicon areas in core region 30, with small feature size, e.g. 0.3 micron or smaller, do not require the protective mask. Protective mask 35 is removed during the CMP step, but provides protection for underlying polysilicon 16 such that dishing does not occur. The advantage of the slightly shrunk protective mask is the maintenance of a flat polysilicon topography at corner 56 between active silicon region 36 and isolation region 10 during CMP. This prevents the occurrence at the corner 56 of residues of oxide or nitride from the protective mask following CMP, which would prevent complete stripping of the poly and cause device problems.

FIG. 6b illustrates the second embodiment of our inventive process after polysilicon CMP. The patterned protective mask 35' as shown in FIG. 4b is utilized to provide protection for underlying polysilicon over not only the peripheral active silicon regions 36, but also over the peripheral trench isolation regions 60. The protective mask covers substantially the entire peripheral area of the chip, with an opening window which leaves the central memory cell array with small feature sizes uncovered. To prevent residual polysilicon film atop the edge 62 of the memory cell array, the opening window of the protective mask is made larger than the memory cell array, typically 5 to 30 microns larger. Advantages of this second embodiment of the patterned protective mask include simple lithography with non-critical alignment, as well as prevention of thinning of trench oxide and possible opening or enlarging of the trench seam during ONO overetch. The possible non-planar topography at corner 56 after CMP necessitates care in removing oxide or nitride residues.

FIG. 7 is a functional illustration of a portion of a flash memory device along a bit-line, showing tunnel oxide 12, floating polysilicon gate 18, ONO layer 64, and control gate 68.

Our inventive method, including the use of a protective mask in the peripheral device areas of a flash memory chip during polysilicon CMP, prevents polysilicon dishing in large surface area peripheral devices, and prevents damage to peripheral devices during subsequent ONO and polysilicon etch. Heretofore, self aligned CMP poly gate processes were not successful for flash memory. This improvement makes possible the use of self-aligned CMP polysilicon floating gate technology in the manufacture of flash memory circuits, thereby enabling increased density, enhancing performance at high yield.

It is not intended that this invention be restricted to the exact embodiments described herein. For example, process details such as exact thickness and dimensions of protective masks may vary without departing from the inventive concept. The protective mask may also cover different portions of the peripheral region than those described in detail herein: for example, a protective mask may be designed which covers the peripheral trench isolation regions, but leaves the peripheral large gate regions partially or completely uncovered. It is also believed that alternate materials such as silicon oxynitride may be used in place of silicon dioxide or silicon nitride as a protective mask. The scope of the invention should be construed in view of the claims.

With this in mind, we claim:

1. A method of protecting a peripheral region while forming a self-aligned gate in a core region, said method comprising the steps of:

fabricating a dielectric layer interrupted by trenches filled with insulating material in a silicon substrate to form a structure. wherein said structure includes said peripheral region and said core region;

depositing a polysilicon layer on said dielectric layer and said insulating material;

forming a protective mask layer on said polysilicon layer over an area of said peripheral region; and applying polysilicon polishing to said polysilicon layer and said protective mask layer.

2. The method of claim 1, wherein said protective mask layer comprises silicon dioxide.

3. The method of claim 4, wherein said protective mask layer comprises silicon nitride.

4. The method of claim 1, wherein said area of said peripheral region substantially covers an active portion of said peripheral region.

5. The method of claim 4, wherein said area is defined by a photomask obtained by shrinking a feature size in said peripheral region.

6. The method of claim 1, wherein said area of said peripheral region substantially covers said peripheral region.

7. The method of claim 6, wherein said area is defined by a photomask having an opening window for said core region.

8. The method of claim 1, wherein said core region is a flash memory circuit.

9. The method of claim 1, further comprising the steps of:

depositing an ONO layer on said structure after said applying polysilicon polishing step;

masking said core region; and etching said remaining polysilicon layer in said peripheral region.

10. An integrated circuit fabricated using a method of protecting a peripheral region while forming a self-aligned gate in a core region, said method comprising the steps of:

fabricating a dielectric layer interrupted by trenches filled with insulating material in a silicon substrate to form a structure, wherein said structure includes said peripheral region and said core region;

depositing a polysilicon layer on said dielectric layer and said insulating material;

forming a protective mask layer on said polysilicon layer over an area of said peripheral region; and applying polysilicon polishing to said polysilicon layer and said protective mask layer.

11. The integrated circuit of claim 10, wherein said area of said peripheral region substantially covers an active portion of said peripheral region.

12. The integrated circuit of claim 10, wherein said area of said peripheral region substantially covers said peripheral region.

13. The integrated circuit of claim 10, wherein said method further comprising the steps of:

depositing an ONO layer on said structure after said applying polysilicon polishing step:

masking said core region; and etching said remaining polysilicon layer in said peripheral region.

* * * * *